US012164233B2

United States Patent
Konijnenberg et al.

(10) Patent No.: US 12,164,233 B2
(45) Date of Patent: Dec. 10, 2024

(54) METROLOGY METHOD AND APPARATUS FOR OF DETERMINING A COMPLEX-VALUED FIELD

(71) Applicant: ASML Netherlands B.V., Veldhoven (NL)

(72) Inventors: Alexander Prasetya Konijnenberg, Eindhoven (NL); Willem Marie Julia Marcel Coene, Geldrop (NL); Nitesh Pandey, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 387 days.

(21) Appl. No.: 17/619,961

(22) PCT Filed: May 14, 2020

(86) PCT No.: PCT/EP2020/063426
§ 371 (c)(1),
(2) Date: Dec. 16, 2021

(87) PCT Pub. No.: WO2020/254041
PCT Pub. Date: Dec. 24, 2020

(65) Prior Publication Data
US 2022/0299888 A1    Sep. 22, 2022

(30) Foreign Application Priority Data

Jun. 17, 2019 (EP) .................................... 19180565
Sep. 5, 2019 (EP) .................................... 19195599
Oct. 8, 2019 (EP) .................................... 19202049

(51) Int. Cl.
*G03F 7/00* (2006.01)
*G01B 9/02* (2022.01)
(Continued)

(52) U.S. Cl.
CPC ..... *G03F 7/70616* (2013.01); *G01B 9/02084* (2013.01); *G01N 21/9501* (2013.01);
(Continued)

(58) Field of Classification Search
CPC .............. G03F 7/70616; G03F 7/7065; G03F 7/70666; G01B 9/02084; G01B 2210/56;
(Continued)

(56) References Cited

U.S. PATENT DOCUMENTS 6,952,253 B2   10/2005  Lof et al.
7,701,577 B2    4/2010  Straaijer
(Continued)

FOREIGN PATENT DOCUMENTS

CN    104749890 A    7/2015
CN    106797101 A    5/2017
(Continued)

OTHER PUBLICATIONS

International Search Report and Written Opinion of the International Searching Authority directed to related International Patent Application No. PCT/EP2020/063426, mailed Sep. 16, 2020; 9 pages.
(Continued)

*Primary Examiner* — Paul Dinh
(74) *Attorney, Agent, or Firm* — Sterne, Kessler, Goldstein & Fox P.L.L.C.

(57) ABSTRACT

Disclosed is a method of determining a complex-valued field relating to a sample measured using an imaging system. The method comprises obtaining image data relating to a series of images of the sample, imaged at an image plane of the imaging system, and for which at least two different modulation functions are imposed in a Fourier plane of the
(Continued)

imaging system; and determining the complex-valued field from the imaging data based on the imposed modulation functions.

14 Claims, 8 Drawing Sheets

(51) Int. Cl.
*G01N 21/95* (2006.01)
*G06V 10/42* (2022.01)

(52) U.S. Cl.
CPC ........ *G03F 7/7065* (2013.01); *G03F 7/70666* (2013.01); *G06V 10/431* (2022.01)

(58) Field of Classification Search
CPC .... G01B 9/027; G01B 11/2441; G01B 11/25; G01N 21/9501; G06V 10/431; G03H 1/0866; G03H 1/0443; G02B 21/0016; G02B 21/365
USPC .......................................................... 716/51
See application file for complete search history.

(56) References Cited

U.S. PATENT DOCUMENTS

| | | | |
|---|---|---|---|
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 9,264,696 | B2 | 2/2016 | Sileira et al. |
| 9,853,412 | B2 | 12/2017 | Nikipelov et al. |
| 2005/0057756 | A1* | 3/2005 | Fang-Yen .......... G01B 9/02057 356/497 |
| 2007/0247637 | A1* | 10/2007 | de Groot ............ G01B 11/0675 356/511 |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2016/0061750 | A1 | 3/2016 | Den Boef et al. |
| 2016/0161863 | A1 | 6/2016 | Den Boef et al. |
| 2016/0345820 | A1* | 12/2016 | Frisken ................ A61B 3/0025 |
| 2016/0370717 | A1 | 12/2016 | Den Boef et al. |
| 2018/0210187 | A1 | 7/2018 | Dai et al. |
| 2019/0107781 | A1 | 4/2019 | Tinnemans et al. |

FOREIGN PATENT DOCUMENTS

| | | |
|---|---|---|
| EP | 1 628 164 A2 | 2/2006 |
| EP | 3 480 554 A1 | 5/2019 |
| TW | 2012-34100 A1 | 8/2012 |
| WO | WO 2011/012624 A1 | 2/2011 |
| WO | WO 2019/166190 A1 | 9/2019 |

OTHER PUBLICATIONS

Raz et al., "Direct phase retrieval in double blind Fourier holography," Optical Society of America, Optics Express, vol. 22, No. 21, Oct. 6, 2014; pp. 24935-24950.

Lu et al., "Noniterative spatially partially coherent diffractive imaging using pinhole array mask," Advanced Photonics, vol. 1, No. 1, Jan. 28, 2019; pp. 1-8.

Shao et al., "Spatial coherence measurement and partially coherent diffractive imaging using self-referencing holography," Optical Society of America, Optics Express, vol. 26, No. 4, Feb. 19, 2018; pp. 4479-4490.

Gao et al., "Phase-shifting Zernike phase contrast microscopy for quantitative phase measurement," Optical Society of America, Optics Letters, vol. 36, No. 21, Nov. 1, 2011; pp. 4305-4307.

Zheng et al., "Wide-field, high-resolution Fourier ptychographic microscopy," Nature Photonics, vol. 7, Jul. 28, 2013; pp. 1-15.

\* cited by examiner

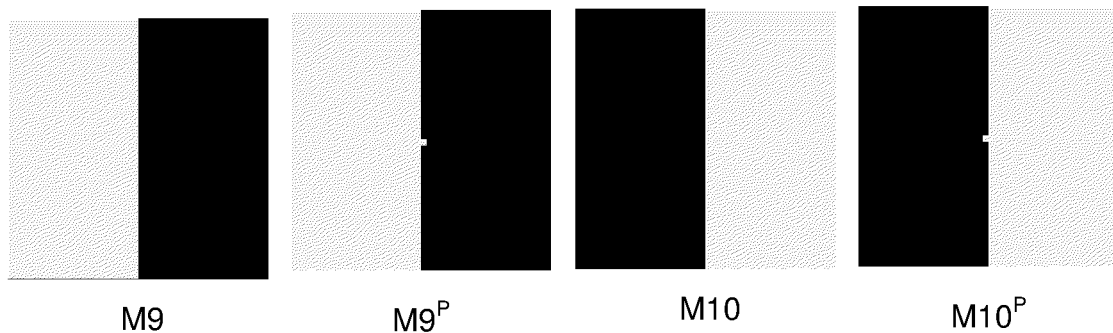
| M9 | M9$^P$ | M10 | M10$^P$ |
Fig. 7
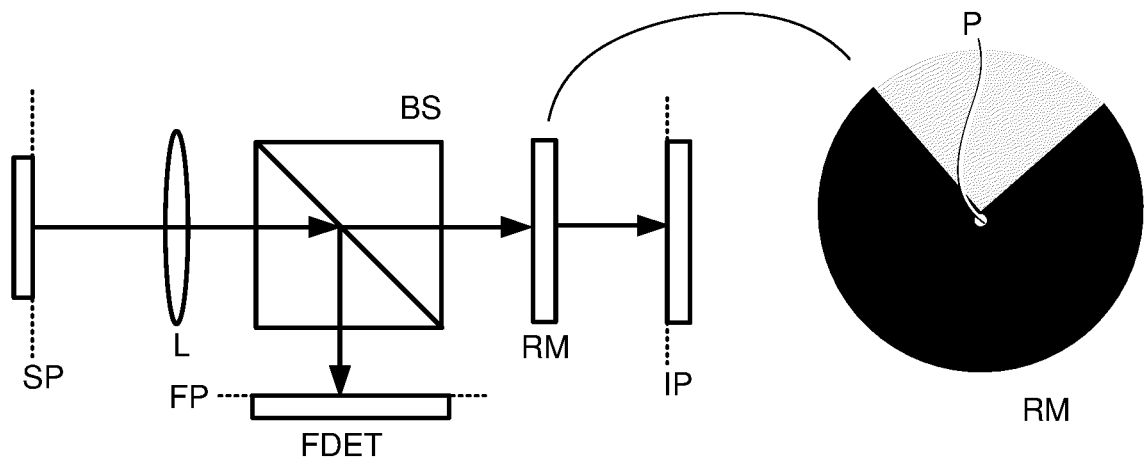
Fig. 8
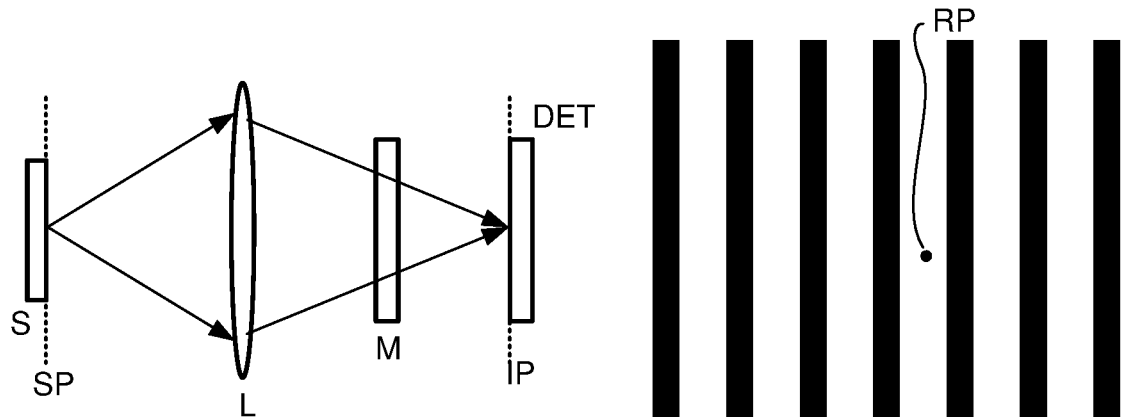
Fig. 9
Fig. 10

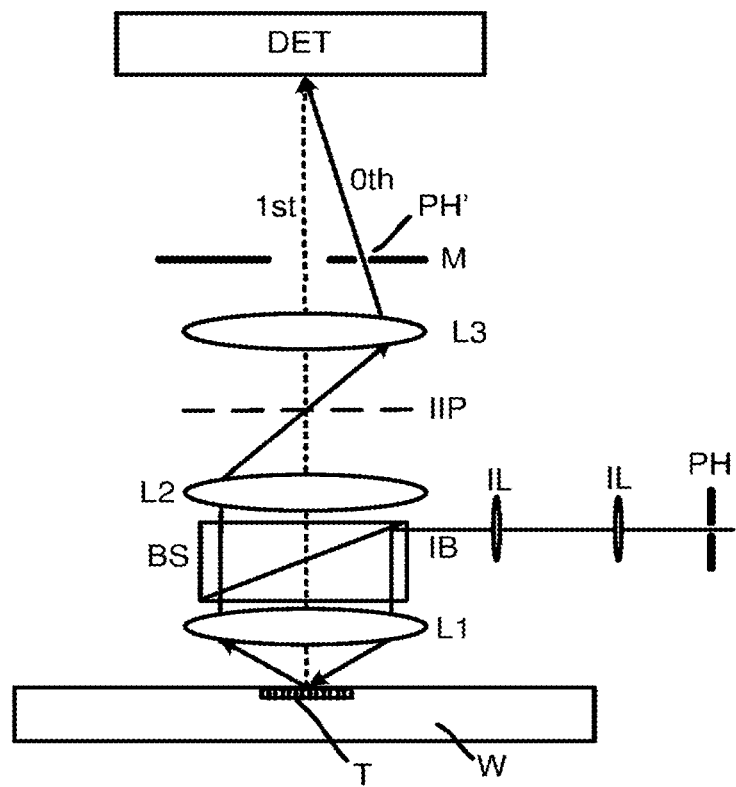
Fig. 14(a)
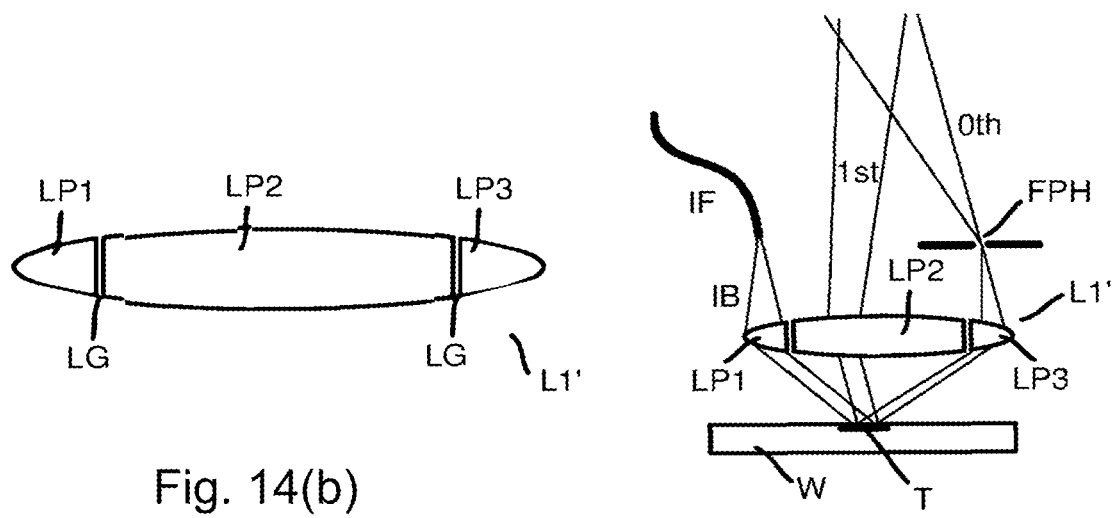
Fig. 14(b)
Fig. 14(c)

METROLOGY METHOD AND APPARATUS FOR OF DETERMINING A COMPLEX-VALUED FIELD

CROSS REFERENCE TO RELATED APPLICATIONS

This application claims priority of EP application 19180565.4 which was filed on 2019 Jun. 17 and EP application 19195599.6 which was filed on 2019 Sep. 5 and EP application 19202049.3 which was filed on 2019 Oct. 8 and whom are incorporated herein in their entirety by reference.

FIELD

The present invention relates to a metrology apparatus or an inspection apparatus for determining a characteristic of structures on a substrate. The present invention also relates to a method for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

A metrology device may use computationally retrieved phase to apply aberration correction to an image captured by the metrology device. One method described, for the calculation of phase, uses multiple diverse images, such as multiple images of the same target under different focus conditions. This typically requires mechanical movement of the sample (e.g., target). Also, it is assumed that moving the sample through focus is equivalent to moving the detector through focus. The validity of this assumption is questionable. Furthermore, the defocus range over which this assumption is valid may be too short to obtain sufficient information for a successful reconstruction. The reconstruction itself is performed using an iterative algorithm, which is computationally expensive, and cannot be certain to converge to the optimal solution. Also, it is unclear how spatial partial coherence will affect the reconstruction result.

SUMMARY

It is desirable to reduce calculation time and increase throughput when performing a complex-valued field measurement.

Embodiments of the invention are disclosed in the claims and in the detailed description.

In a first aspect of the invention there is provided a method of determining a complex-valued field relating to a sample measured using an imaging system, comprising: obtaining image data relating to a series of images of the sample, imaged at an image plane of the imaging system, and for which at least two different modulation functions are imposed in a Fourier plane of the imaging system; and determining the complex-valued field from the imaging data based on the imposed modulation functions.

In a second aspect of the invention there is provided a metrology device for performing the method of the first aspect, comprising: an imaging system for imaging a field reflected from a sample; at least one modulator at a Fourier plane of the imaging system for defining each modulation function; and a detector at an image plane of the imaging system for capturing each of said images.

BRIEF DESCRIPTION OF THE DRAWINGS

Embodiments of the invention will now be described, by way of example only, with reference to the accompanying schematic drawings, in which:

FIG. 7 is a schematic illustration of two pairs of masks usable in the method shown in FIG. 6;

FIG. 8 is a schematic illustration of a metrology apparatus according to a further embodiment of the invention;

FIG. 9 is a schematic illustration of a metrology apparatus according to additional embodiments of the invention;

FIG. 10 is a schematic illustration of a grating mask usable in a second non-iterative method of determining a complex-valued field, according to an embodiment of the invention;

FIGS. 14(*a*)-14(*c*) are schematic illustrations of FIG. 14(*a*) a metrology apparatus according to an embodiment suitable for zeroth order self-referencing holography; FIG. 14(*b*) and FIG. 14(*c*) detail thereof of an optional divided objective lens embodiment of the metrology apparatus of FIG. 14(*a*);

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
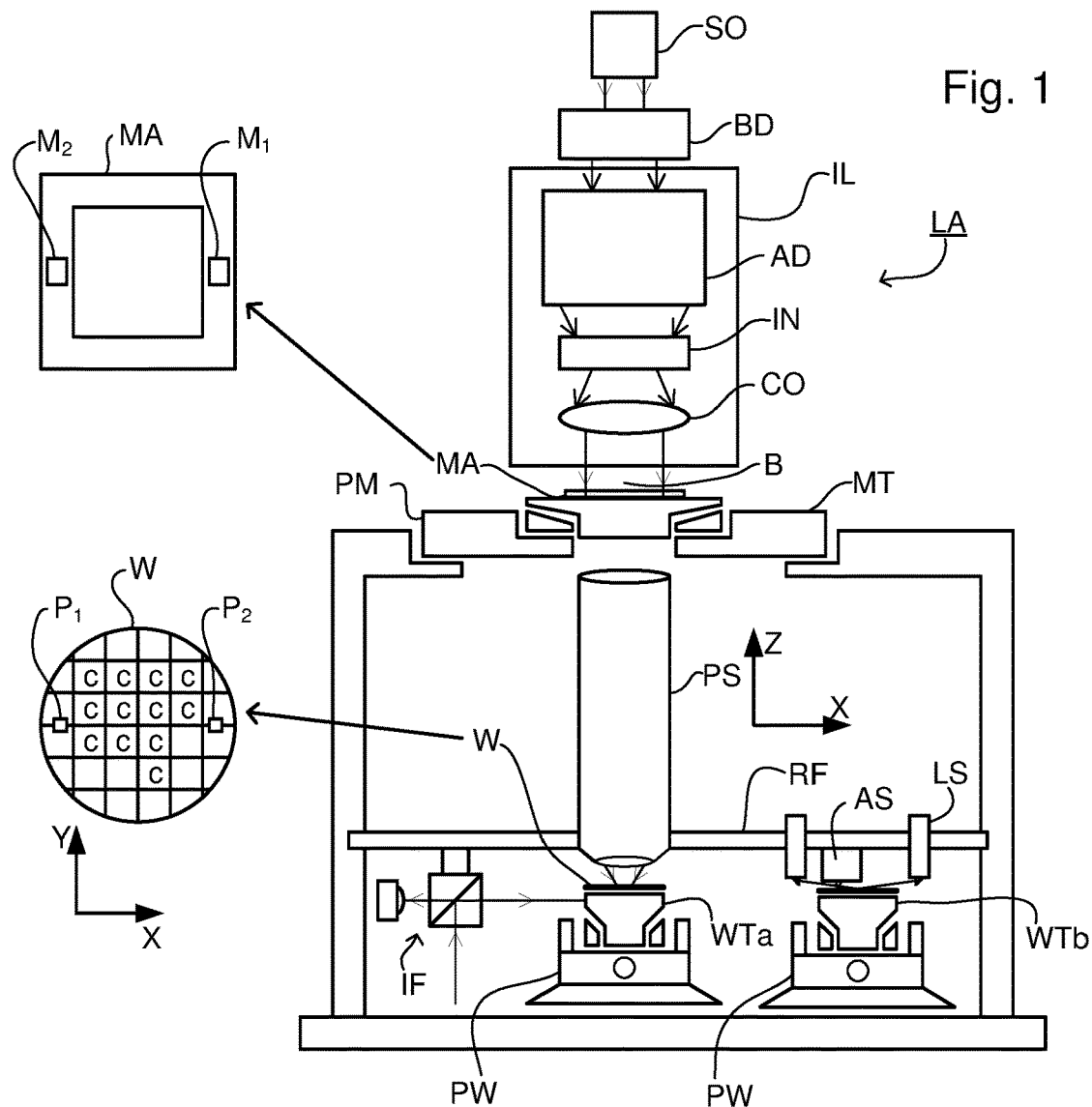
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
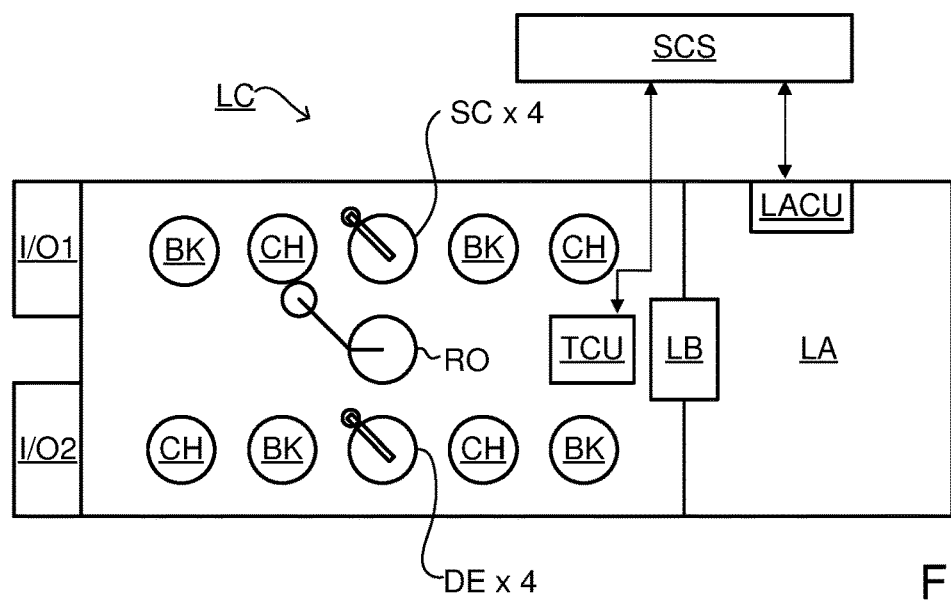
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
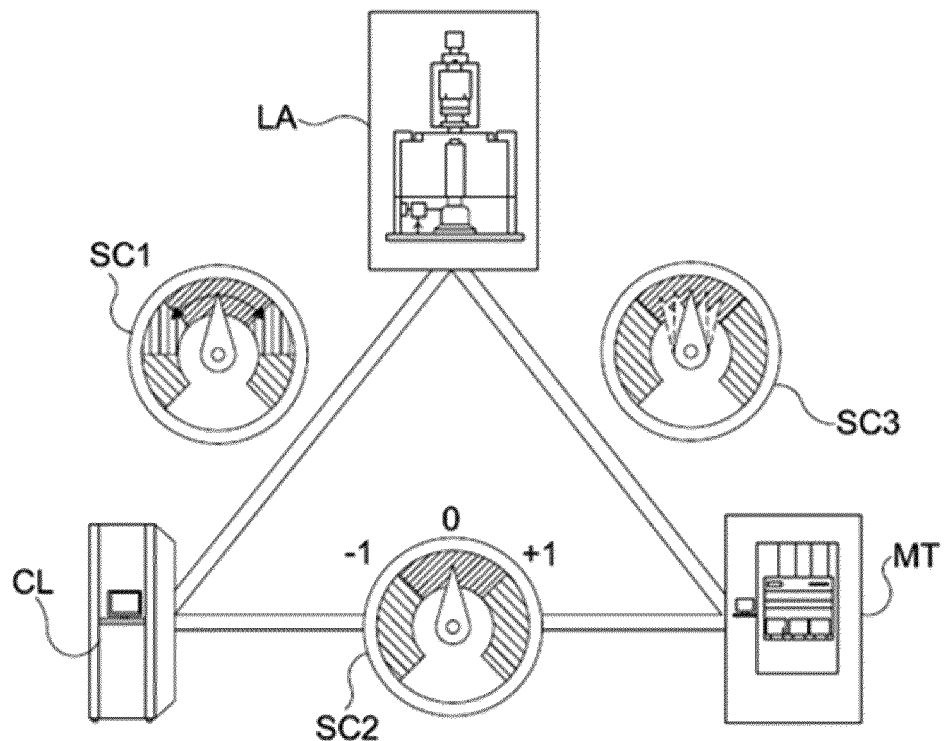
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray and visible to near-IR wave range.

Figure 4:
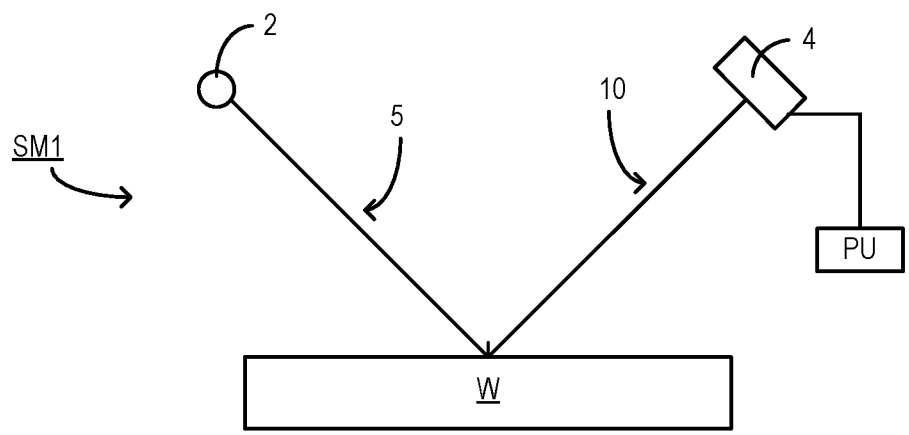
FIG. 4 is a schematic illustration of a scatterometry apparatus.
Figure 4:
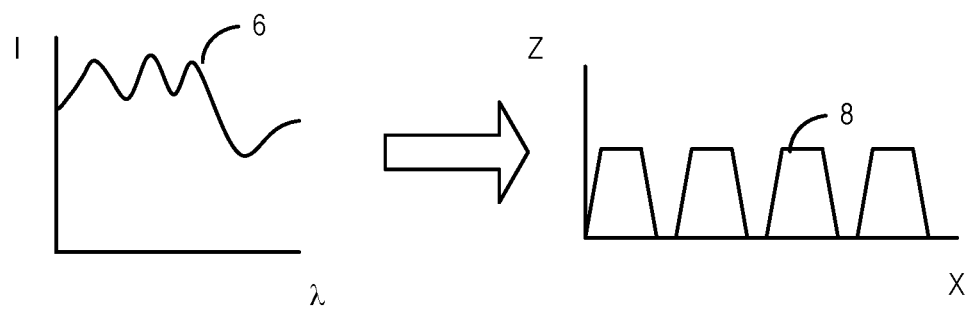

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety A metrology apparatus which employs a computational imaging/phase retrieval approach has been described in US patent publication US2019/0107781, which is incorporated herein by reference. Such a metrology device may use relatively simple sensor optics with unexceptional or even relatively mediocre aberration performance. As such, the sensor optics may be allowed to have aberrations, and therefore produce a relatively aberrated image. Of course, simply allowing larger aberrations within the sensor optics will have an unacceptable impact on the image quality unless something is done to compensate for the effect of these optical aberrations. Therefore, computational imaging techniques are used to compensate for the negative effect of relaxation on aberration performance within the sensor optics.

In such an approach, the intensity and phase of the target is retrieved from one or multiple intensity measurements of the target. The phase retrieval may use prior information of the metrology target (e.g., for inclusion in a loss function that forms the starting point to derive/design the phase retrieval algorithm). Alternatively, or in combination with the prior information approach, diversity measurements may be made. To achieve diversity, the imaging system is slightly altered between the measurements. An example of a diversity measurement is through-focus stepping, i.e., by obtaining measurements at different focus positions. Alternative methods for introducing diversity include, for example, using different illumination wavelengths or a different wavelength range, modulating the illumination, or changing the angle of incidence of the illumination on the target between measurements. The phase retrieval itself may be based on that described in the aforementioned US2019/0107781, or in patent application EP17199764 (also incorporated herein by reference). This describes determining from an intensity measurement, a corresponding phase retrieval such that interaction of the target and the illumination radiation is described in terms of its electric field or complex field ("complex" here meaning that both amplitude and phase information is present). The intensity measurement may be of lower quality than that used in conventional metrology, and therefore may be out-of-focus as described. The described interaction may comprise a representation of the electric and/or magnetic field immediately above the target. In such an embodiment, the illuminated target electric and/or magnetic field image is modelled as an equivalent source description by means of infinitesimal electric and/or magnetic current dipoles on a (e.g., two-dimensional) surface in a plane parallel with the target. Such a plane may, for example be a plane immediately above the target, e.g., a plane which is in focus according to the Rayleigh criterion, although the location of the model plane is not critical: once amplitude and phase at one plane are known, they can be computationally propagated to any other plane (in focus, out of focus, or even the pupil plane). Alternatively, the description may comprise a complex transmission of the target or a two-dimensional equivalent thereof.

The phase retrieval may comprise modeling the effect of interaction between the illumination radiation and the target on the diffracted radiation to obtain a modelled intensity pattern; and optimizing the phase and amplitude of the electric field/complex field within the model so as to minimize the difference between the modelled intensity pattern and the detected intensity pattern. More specifically, during a measurement acquisition, an image (e.g., of a target) is captured on detector (at a detection plane) and its intensity measured. A phase retrieval algorithm is used to determine the amplitude and phase of the electric field at a plane for example parallel with the target (e.g., immediately above the target). The phase retrieval algorithm uses a forward model of the sensor (e.g. aberrations are taken into account), to computationally image the target to obtain modelled values for intensity and phase of the field at the detection plane. No target model is required. The difference between the modelled intensity values and detected intensity values is minimized in terms of phase and amplitude (e.g., iteratively) and the resultant corresponding modelled phase value is deemed to be the retrieved phase. Specific methods for using the complex field in metrology applications are described in PCT application PCT/EP2019/052658, also incorporated herein by reference.

Such iterative algorithms are computationally expensive and therefore take a long time to converge to a solution, with no guarantee when it will do so, or that the solution is the optimal solution. Therefore a number of non-iterative methods for determining the complex field from intensity images will be described. Also, there are assumptions inherent in using focus diversity measurements which are of questionable validity, such as the assumption that moving the sample through focus is equivalent to moving the detector through focus. As such, the methods described herein (which additionally include an iteratively calculated complex field embodiment) obviate the need for such through focus diverse measurements.

The methods described herein comprise obtaining a plurality of diverse images for which one or more alterations have been made in a Fourier plane (or pupil plane) of the radiation reflected by the sample (e.g., a target) between images. By applying appropriate (amplitude and/or phase) modulations (e.g., using a modulator or mask) in the Fourier plane, it is possible to capture a sequence of images in an image plane, from which the complex-valued field can be reconstructed non-iteratively.

Figure 5:
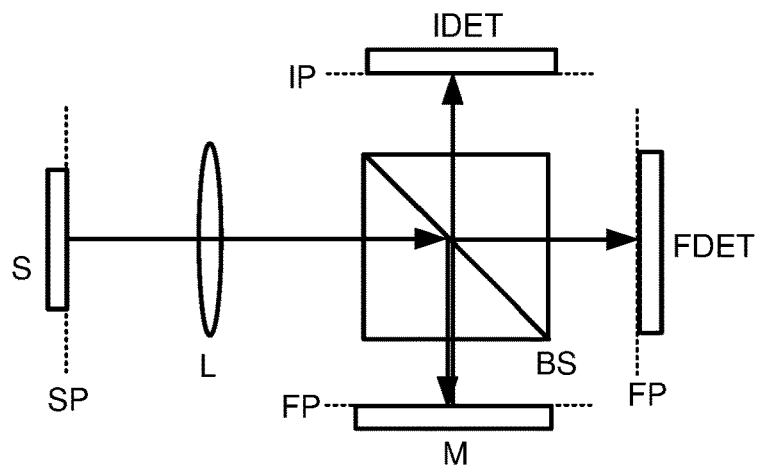
FIG. 5 is a schematic illustration of a metrology apparatus according to an embodiment of the invention.

FIG. 5 illustrates a basic arrangement which can be used for many of the embodiments described herein. It shows a sample S or target in a sample plane SP. A radiation field reflected from the sample S passes through an imaging lens (or imaging system) L and beamsplitter BS to a mask M or amplitude modulator in a Fourier plane FP. The mask M alters or modulates the amplitude of the Fourier transform of the field (the Fourier transformed reflected field) reflected by the sample S. A first detector IDET or camera at an image plane IM detects the image of the field reflected by the sample, after having been Fourier filtered by the mask M. An optional second detector or camera FDET can be located at a Fourier plane FP for imaging the intensity Fourier transform of the field reflected by the sample before modulation by the mask M.

The second detector FDET and associated Fourier imaging branch (and therefore beamsplitter BS) are optional. They are useful in embodiments such as that illustrated by FIG. 6 (described below), for which a particular mask attribute or modulation should ideally be applied in a particular region of the Fourier transform of the field. As such, the image recorded by second detector FDET in the Fourier plane can help determine which amplitude modulations should be applied. Additionally, or alternatively, such an image may be used as additional information for refining the reconstruction using iterative phase retrieval algorithms.

Figure 6:
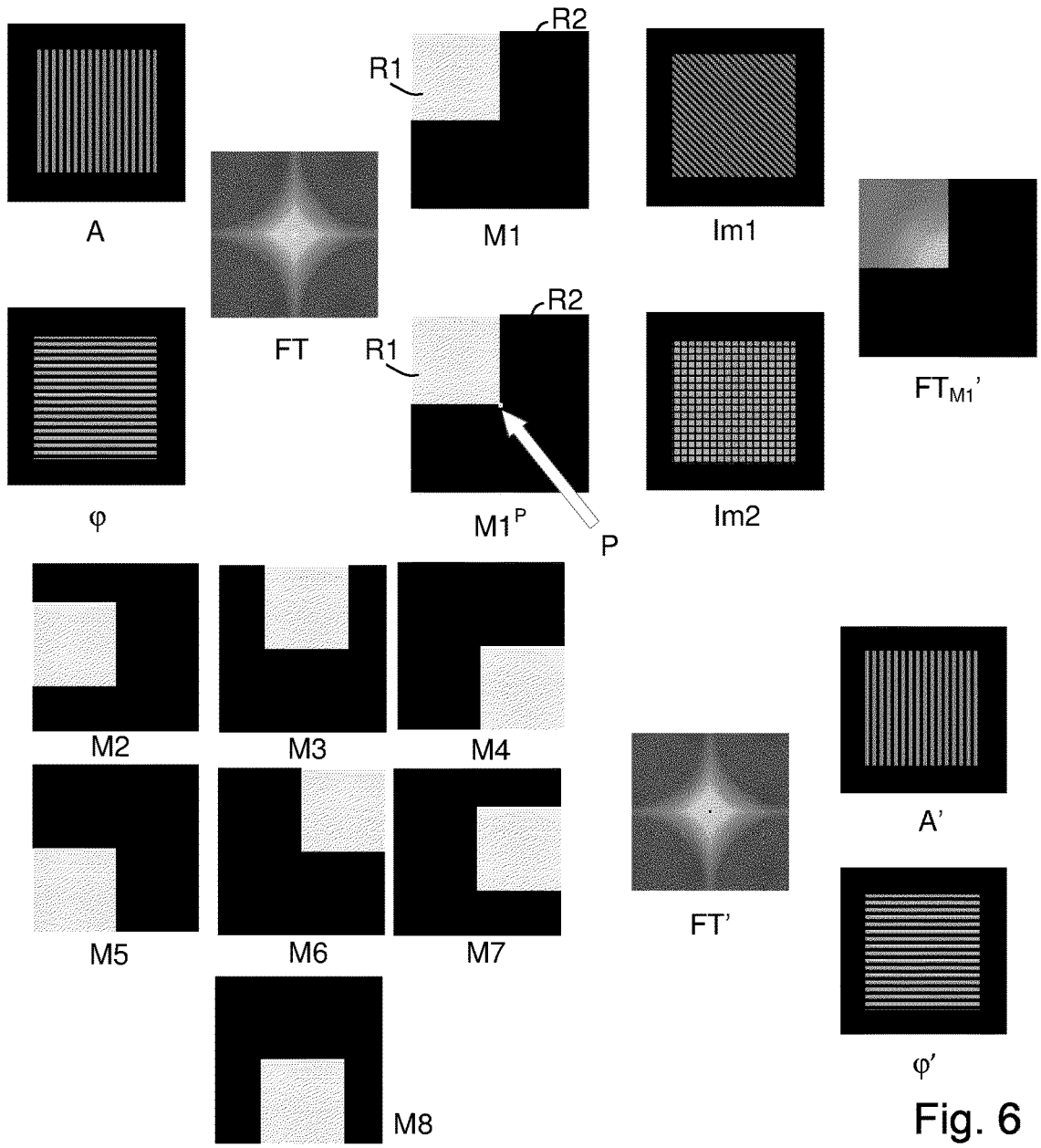
FIG. 6 is a schematic illustration of a first non-iterative method of determining a complex-valued field, according to an embodiment of the invention.

FIG. 6 illustrates an embodiment where a plurality of matching pairs of masks M1, M1$^P$ are applied to the Fourier transformed reflected field FT, each mask of a pair differing from one another only in a (e.g., small) perturbation region P. The masks may be implemented, for example, by a (e.g., digital) binary amplitude modulator (e.g. a Digital Micromirror Device, DMD) providing two different modulations for each pair of masks.

The reflected field from the sample comprises a sample amplitude component A and a (unknown) sample phase component φ. The Fourier transformed reflected field FT, which is the field incident on the mask/binary amplitude modulator (and the Fourier detector FDET, if present) in the Fourier plane FP of the imaging lens L, is modulated using the first of the matching pair of masks, i.e., unperturbed mask M1. The image Im1 in the image plane resultant from the Fourier modulated field is captured and recorded (e.g., by image plane detector IDET). The second of the matching pair of masks, i.e., perturbed mask $M1^P$, is then used to modulate the Fourier transformed reflected field FT and the resultant image Im2 in the image plane is captured and recorded (e.g., by image plane detector IDET). A reconstructed portion of the Fourier transform $FT_{M1}'$ can be reconstructed from the difference of the inverse Fourier transforms of each of the two recorded images Im1, Im2.

In an embodiment, the two different modulation functions M1, $M1^P$ are applied by a binary amplitude modulator (i.e., mask M is implemented using a binary amplitude modulator). In the lighter regions R1, radiation is reflected (or transmitted depending on the setup) without being altered, while in the darker regions R2, the amplitude is set to 0. The difference between the two modulation functions is a small perturbation region P where the amplitude is modulated in one mask but not the other. In an embodiment, the small perturbation may comprise essentially a "pinhole", which reflects radiation in the perturbed mask $M1^P$, but not in the unperturbed mask M1 (e.g., amplitude set to zero). In this embodiment, the perturbation region should be at the boundary of the reconstruction region R1 (e.g., the reflected area). Also, the perturbation region should be in a location where the amplitude of the Fourier transform is high, in order for the reconstruction scheme to be noise robust. The camera FDET in the Fourier plane of the imaging lens can be used to help identify such a region.

These steps are repeated for a number of other pairs of masks M2-M8 (i.e., each having an corresponding perturbed mask $M2^P$-$M8^P$, not shown) for which the reflected region is moved around, so as to cover the full Fourier transformed reflected field FT (e.g., apart for the perturbation region, which is common for the perturbed masks $M1^P$-$M8^P$). By combining, e.g., stitching together, the resultant reconstructed portions $FT_{M1}'$-$FT_{M8}'$ (only $FT_{M1}'$ shown), it is possible to reconstruct almost the entire Fourier transform FT' non-iteratively (i.e., all except for the perturbation region P). Inverse Fourier transforming the result yields a reconstruction of the complex-valued field A', φ' reflected by the sample. The more pairs of masks used, the more robust the measurements will be. However, it will be readily apparent that the full field can be reconstructed with only four pairs of masks e.g., M1, M4, M5 and M6 (along with their perturbed counterparts) provided at least two of these have slightly larger reflected regions.

The reconstruction method therefore can be described as a self-referencing holographic method, of which more detail can be found in the publication: Y. Shao et al., "Spatial coherence measurement and partially coherent diffractive imaging using self-referencing holography," Opt. Express 26, 4479-4490 (2018) which is incorporated herein by reference.

In principle, the reconstruction region could be made even larger, in order to reduce the required number of measurements. FIG. 7 illustrates an example with two pairs of masks M9, $M9^P$ and M10, $M10^P$. Using these however, could increase the noise sensitivity of the scheme because the total field in the perturbation region should be strong compared to the total field in the reconstruction region, and it could make final refinement using iterative algorithms less reliable because there is less redundancy in the measurements.

Note that final reconstruction is not perfect because the Fourier transform is not reconstructed in the perturbation region (where the amplitude will typically be high). There are a number of ways that this may be addressed. In a first example, the image recorded by the Fourier camera FDET in the Fourier plane of the imaging lens could be used to infer the amplitude in the perturbation region. Alternatively, the non-iterative reconstruction scheme described above could be performed for at least two different perturbation regions, with one of these reconstructions used to complete the other. As another alternative, the reconstruction may be refined using an iterative algorithm. The data set which is used for the non-iterative reconstruction also allows for reconstruction using Fourier ptychography. The fact that a good initial guess is available (e.g., inferred from the Fourier camera FDET) should avoid problems of non-convergence and high computational expense.

The mask may comprise a phase modulator, instead of a binary amplitude modulator. In such an embodiment, the reconstruction could be performed by applying three phase-shifts in the perturbation region (which is known as phase shifting holography/interferometry, also termed Quantitative Zernike Phase contrast microscopy, see P. Gao et al., "Phase-shifting Zernike phase contrast microscopy for quantitative phase measurement," Opt. Lett. 36, 4305-4307 (2011) incorporated herein by reference). In this case, the perturbation region does not have to be at the edge of the reconstruction region, and instead can be inside the reconstruction region. Thus, there would be no need to perform multiple non-iterative reconstructions for different regions, which need to be stitched together. Disadvantages may include that phase modulators are more expensive than amplitude modulators and are not wavelength independent.

FIG. 8 illustrates another alternative, where the mask comprises a mechanically moving mask RM, such as a rotating mask. Such a mask would not suffer from pixelation. Furthermore, as such a mask is transmissive, the beam is not required to make an additional pass through the beamsplitter BS, thus reducing intensity loss. However, such an embodiment does introduce mechanical movement. The mask RM could be a rotating mask, comprising a selective (e.g., can be opened and closed) perturbation region P. In an example, the perturbation region P coincides with the axis of rotation of the rotating mask RM.

A number of other embodiments will be described with relation to the simplified arrangement schematically illustrated in FIG. 9. This shows a sample S at sample plane SP, an imaging lens L, a mask M and a detector DET at image plane IP. Each of these embodiments may have a pupil/Fourier plane imaging branch as already described.

FIG. 10 illustrates an embodiment where mask M comprises a grating G with a reference pinhole RP. The sample S is illuminated with a spot of limited size. The field reflected by the sample is imaged by the imaging lens L. The amplitude grating G with a reference pinhole RP is placed in the Fourier plane FP of the lens L. The reference pinhole RP should be at a location where the field amplitude is high. A detector or camera DET at the image plane IP of the imaging lens L detects multiple diffraction orders generated by the grating G, within a single image.

There are two ways of interpreting the reconstruction method. One way is to consider it as an instance of Fourier Transform Holography. Another way is to consider it as an instance of phase shifting holography, where multiple interferograms are created simultaneously using a grating. In the Fourier Transform Holography interpretation, the binary amplitude grating has a certain support. The support of the grating and the location of the reference pinhole are such that the autocorrelation of the mask comprises a direct reconstruction of the grating; as such it is simple to extract the grating reconstruction from the mask autocorrelation (i.e., where the mask autocorrelation is obtained by Fourier transforming the intensity image). More detail of such a method for reconstructing the complex valued field using such a method can be found in Lu et al; "*Noniterative spatially partially coherent diffractive imaging using pinhole array mask*" Advanced Photonics, 1(1), 016005 (2019) which is hereby incorporated herein by reference. In the Parallel Phase Shifting Holography interpretation, the reference pinhole generates a reference plane wave in the image plane which interferes with the image field. For phase shifting holography to work, the phase of this reference plane wave must be shifted with respect to the image field. By introducing a grating, duplicates (i.e., diffraction orders) of the image field are generated, which have different phases with respect to the reference plane wave. Thus, by measuring multiple diffraction orders in a single measurement, a single-shot reconstruction is possible.

Therefore, a single measurement and a single Fourier transform is sufficient for reconstruction, and no mechanical movement of components is required. However, the camera is required to have a significantly larger field of view compared to many of the other embodiments described herein.

Figure 11:
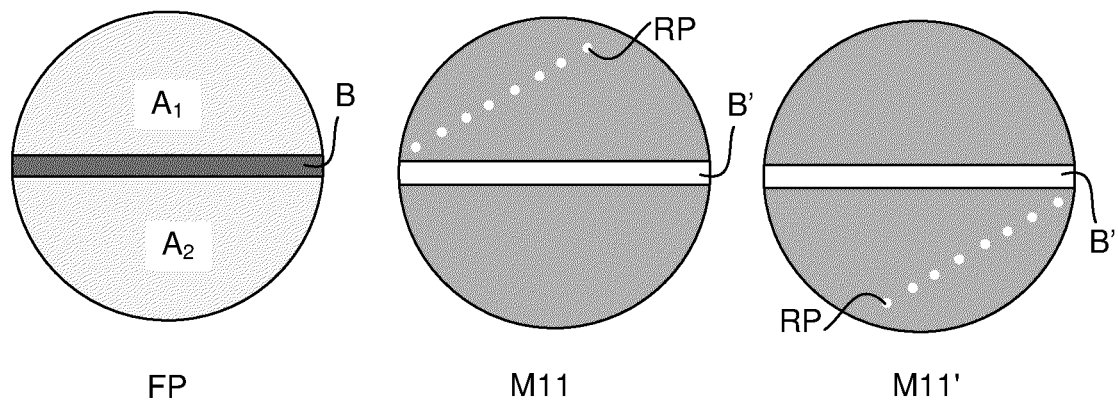
FIG. 11 is a schematic illustration of a third non-iterative method of determining a complex-valued field, according to an embodiment of the invention.

FIG. 11 illustrates a further self-referencing holographic embodiment, which may be implemented using a binary amplitude modulator in the Fourier plane of an imaging lens (e.g., the mask M in FIG. 9 comprises a binary amplitude modulator). In this embodiment, three regions $A_1$, $A_2$, and B are defined in the Fourier plane FP. The non-iterative phase retrieval method comprises several steps.

In a first step, the field in region B is reconstructed via Fourier Transform Holography, using the mask M11 (or two masks M11, M11', for improved robustness). The darker regions indicate blocked regions, lighter regions indicate transmitted regions, where the transmitted regions comprise a region B' corresponding to the reconstruction region B as defined in the Fourier plane and a plurality of reference points RP.

Two measurements are then taken: a first measurement where the field in region $A_1$+B is transmitted by the mask, and a second measurement where only the field in region $A_1$ is transmitted. From these two measurements, it is possible to directly extract the convolution of the field in the region $A_1$ with the field in region B. This can be achieved using methods similar to those already described in relation to the embodiment described in FIG. 6 (e.g., subtract the two measurements and inverse Fourier transform the result, and crop out the twin image). For more detail of how this can be done, reference can be made to aforementioned Y. Shao et al., "Spatial coherence measurement and partially coherent diffractive imaging using self-referencing holography" or O. Raz et al., "Direct phase retrieval in double blind Fourier holography," Opt. Express 22, 24935-24950 (2014), both of which are hereby incorporated herein by reference. The deconvolution obtained in the previous step is applied to the reconstructed field in region B (obtained in the first step) so as to reconstruct the field in region $A_1$.

A third measurement of where the field in region $A_2$+B is transmitted by the mask, and a fourth measurement of where only the field in region A2 is transmitted is then performed and the same procedure is performed to reconstruct the field in region A2. The reconstructions of the fields in regions $A_1$, $A_2$, and B can then be combined to reconstruct the complete field in the Fourier plane. The quality of the reconstruction is degraded due to the finite size of the reference points RP, and the finite width of region B. Therefore, a final refinement using iterative phase retrieval may be performed.

An advantage of this embodiment, compared to that illustrated in FIGS. 6 and 10, is that it does not rely on a single reference point where the amplitude is assumed to be high. Instead, it is assumed that somewhere in region B there is at least one point with high amplitude, which is true for the samples of interest. Therefore, the mask does not need to be shifted to different positions for different samples.

Figure 12:
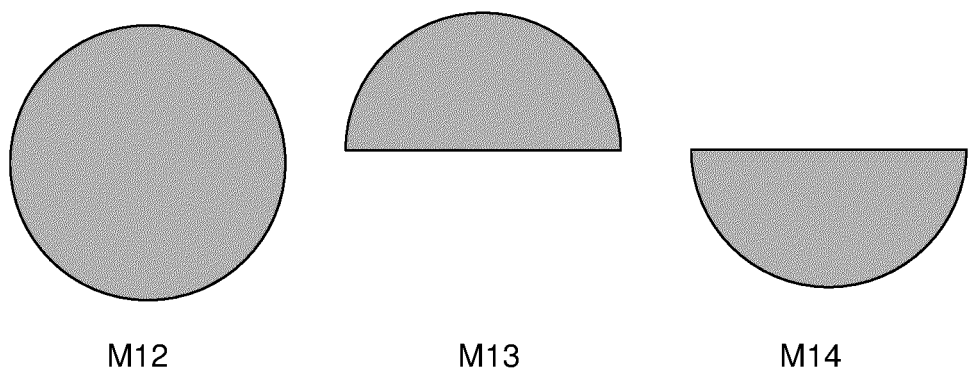
FIG. 12 is a schematic illustration of a fourth non-iterative method of determining a complex-valued field, according to an embodiment of the invention.

It is also possible, in an embodiment, to implement Double-blind Fourier Holography, as described in O. Raz et al., "Direct phase retrieval in double blind Fourier holography," Opt. Express 22, 24935-24950 (2014) which is hereby incorporated herein by reference. In this case, only three measurements are required, each using one of the three masks M12, M13, M14 shown in FIG. 12. From the three corresponding measurements, systems of linear equations can be constructed and solved non-iteratively. However, because each system is quite large and there are many systems (if the camera has N×N pixels, there will be 2N systems), the computation time would be significantly higher than the method proposed above, unless the 2N systems can be solved in parallel.

A further hybrid phase retrieval approach will now be described, which shows some similarities with any of the self-referencing holographic embodiments described above (e.g., with respect to FIG. 6, 7, 8, 10 or 11). Both that embodiment and this embodiment each address the so-called 'twin problem'. The twin problem is the problem that the spatial content of the image comprises two terms in linear imaging (for completeness, there is a third term for non-linear imaging which will be discussed later on, in the so-called effective linearization of the imaging process), wherein one of the linear imaging terms is called the regular image (more specifically the regular field) and the other of the linear terms is called the twin image (more specifically the twin field) because it relates to the point-inverted object wave-field. Thus, mathematically, there are the following two linear terms that contribute to the same image intensity (in Fourier space, with G the 2D spatial-frequency vector in the Fourier space) denoted by I(+G) (for the sake of simplicity here under the assumption that the main (first) spatial frequency propagates along the optical axis of the lens):

Regular image term: relates to Fourier coefficient of the object represented by O(+G) (with O the (complex-valued) Fourier transform of the object field, and G the 2D spatial-frequency vector in the Fourier space of the exit pupil); and Twin image term: relates to Fourier coefficient of the object represented by O*(−G) (where * denotes complex conjugation).

In this embodiment, a more limited aperture selection is proposed rather than the aperture arrangement described by either FIG. 6, 7, 8, 10 or 11; the more limited aperture selection only affecting the presence/omission of the first diffraction order in the imaging process. This aperture selection results in a first image with a selected higher diffraction order (e.g., a first diffraction order) and a second image without the selected higher diffraction order (otherwise being similar). Subtracting the second image from the first image results in an effective linearization of the imaging process, prior to phase-retrieval. This linearization enables a direct non-iterative phase retrieval procedure when combined with focus variation which also solves the twin-problem (the twin problem remains an issue because of the limited aperture selection, in contrast to the more elaborate aperture selection illustrated by FIG. 11, which solves the twin problem directly). It also ensures that the majority of the exit pupil is used for imaging, as opposed to only about half or less in the aforementioned earlier self-referencing holography embodiments, improving robustness to shot noise.

Figure 13:
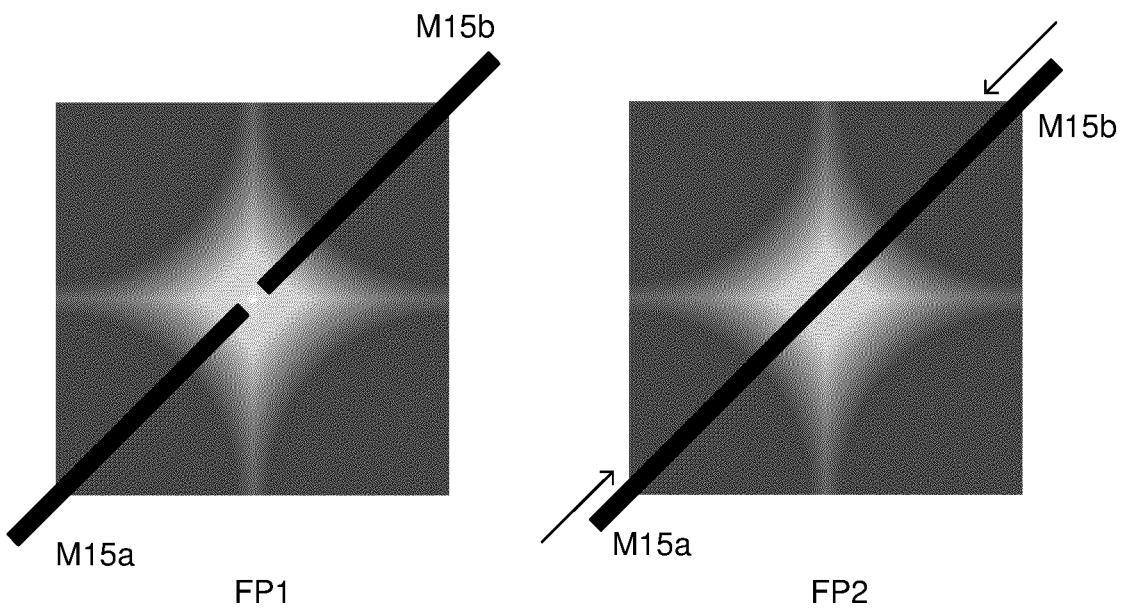
FIG. 13 is a schematic illustration of a fifth non-iterative method of determining a complex-valued field, according to an embodiment of the invention.

FIG. 13 illustrates the basic imaging technique according to an exemplary embodiment. The Figure shows respectively a first Fourier plane representation FP1 for illustrating an arrangement for acquiring a first image $I_z^{wi}$ and a second Fourier plane representation FP2 for illustrating an arrangement for acquiring a second image $I_z^{wo}$ (where z is a focus setting), which together make a first image pair. In the first Fourier plane representation, the selected higher diffraction order peak, e.g., the first diffraction order peak, is unblocked and in the second first Fourier plane representation the selected higher/first diffraction order peak is blocked. It is proposed that multiple image pairs are obtained, e.g., in a thru-focus sequence of one pair per focus setting z, with the difference being calculated for each of these image pairs; this realizing the above described effective linearization.

Any suitable arrangement for selectively blocking the first diffraction order in the Fourier plane (e.g., by a suitably configured mask M or amplitude modulator as illustrated in FIG. 9) while having minimal effect on the rest of the pupil can be used for this embodiment. In the specific example shown, there are two diagonally or obliquely oriented elongated obscurations M15a, M15b which can be moved toward and away from each other to selectively block the first diffraction order (at the center of the Fourier plane). The orientation of the obscurations should be oblique (e.g., at 45 degrees) to the diffraction pattern, so as to minimize blocking of diffracted radiation other than the selectively blocked first diffraction order when configured as obscuration M15b.

The first image $I_z^{wi}(G)$ will comprise both linear and non-linear terms, while the second image $I_z^{wo}(G)$ should comprise only the non-linear terms. Expressed mathematically:

$$I_z^{wi}(G) = \phi(G_1)\phi^*(-G+G_1)p_z(G_1)p_z^*(-G+G_1) +$$
$$\phi(G+G_1)\phi^*(G_1)p_z(G+G_1)p_z^*(G_1) +$$
$$\sum_{\substack{G' \neq G_1 \\ G+G' \neq G_1}} \phi(G+G')\phi^*(G')p_z(G+G')p_z^*(G')$$

$$I_z^{wo}(G) = \sum_{\substack{G' \neq G_1 \\ G+G' \neq G_1}} \phi(G+G')\phi^*(G')p_z(G+G')p_z^*(G')$$

where G 2D-coordinate in exit pupil (spatial frequency in Fourier plane), $G_1$ is the 2D-coordinate of the first diffraction order in exit pupil, $\phi$ is the complex field of the target in the Fourier plane and $p_z$ is the phase transfer function in the Fourier plane.

As such, the difference $\Delta_z$ of the two images should comprise only the linear terms:

$$\Delta I_z(G) = I_z^{wi}(G) - I_z^{wo}(G)$$
$$= \phi(G_1)\phi^*(-G+G_1)p_z(G_1)p_z^*(-G+G_1) +$$
$$\phi(G+G_1)\phi^*(G_1)p_z(G+G_1)p_z^*(G_1)$$

The complex-valued field can therefore be subsequently retrieved as a simple fitting problem resulting in a set of two linear equations. The linearized image intensity described by $\Delta I_z$ (G) comprises a sum of the twin image and regular image:

$$\Delta I_z(G) =$$
$$\underbrace{\phi(G_1)\phi^*(-G+G_1)p_z(G_1)p_z^*(-G+G_1)}_{y} \text{ [twin image].} + \underbrace{\phi(G+G_1)\phi^*(G_1)}_{x}$$
$$p_z(G+G_1)p_z^*(G_1) \text{ [regular image]}$$

where x, y comprise two unknowns. Focus diversity in the thru-focus sequence enables separation of the twin image from the regular image (and therefore solve the twin problem); e.g., by solving a simple linear least-squares fitting for the two unknowns x, y:

$$\Delta I_z = x\, px_z + y\, py_z \text{ for } z \in \{z_1, z_2, \ldots, z_N\}$$

With x retrieved, i.e., $x = \phi(G+G_1)\phi^*(G_1)$ the next step is to retrieve $\phi^*(G_1)$ in order to obtain the complex-valued field $\phi(G+G_1)$. The term $\phi^*(G_1)$ can be freely chosen to have zero phase. Denoting this amplitude as B, then for each defocus value z, the amplitude can be determined via the DC-component of both images of the image pair $I_z^{wi}$ and $I_z^{wo}$ since:

$$DC[I_z^{wi}] = DC[I_z^{wo}] + B^2$$

It should be noted that this value of B may preferably be determined at each phase-retrieval step (e.g. for the two illumination settings leading to $+1^{st}$ order and $-1^{st}$ order dark-field imaging).

Another issue with some of the self-referencing holography methods described herein which rely on a pinhole (perturbation region) for the referencing (e.g., those described in relation to FIGS. 6, 7, 8 and 10) is that the mask may need to be shifted to different positions for different samples, because the pinhole needs to be located at a point where the field intensity is high. If different samples have targets with different pitches, there will be a shift of the point in the field which has high intensity. To address this, an alternative measurement arrangement is proposed, which uses the zeroth order from the scattered radiation (i.e., the specular reflected radiation from the sample) as the reference.

FIG. 14(a) schematically illustrates an arrangement for achieving zeroth order self-referenced holography. A point source (e.g., illumination pinhole PH) is imaged onto the pupil plane of a first lens L1 (e.g., the objective lens) by one or more input lenses IL. First lens L1 focuses the illuminating beam IB onto a sample T on substrate W, and captures the reflected zeroth order 0th (solid line) and at least one higher diffracted order 1st (e.g., +/−1st order-dotted line). A second lens L2 creates an intermediate image at an intermediate image plane IIP. The intermediate image is re-imaged with a (e.g., single) third lens L3. The mask M comprising a mask pinhole PH' is located at the Fourier plane FP of Lens L3. The location of the mask pinhole PH' coincides with the zeroth order 0th. As before, two images are taken: one with the mask pinhole PH' open, and one with mask pinhole PH' blocked. Optionally, if the field at the mask pinhole PH' does not generate a homogeneous plane wave at the detector DET, a third image can be taken comprising only the field transmitted by the mask pinhole PH'.

Mask M may comprise an aperture which substantially passes the full field (comprising the full first diffraction order) other than the selective opening and closing of mask pinhole PH (which is at a fixed location coinciding with the location of the zeroth order in this Fourier plane). With respect to the embodiment of FIG. 10, using the zeroth order as reference means that the pinhole can be located at the edge of the grating G, rather than in its interior. However, if the pinhole, which is at the zeroth order, is sufficiently far away from the reconstruction region, which is at the first order, then no grating is needed, as regular single-shot Fourier Transform Holography can be applied using the methods of this embodiment.

The reconstruction method may again comprise a method similar to those already described in relation to the embodiment described in FIG. 6 (e.g., subtract the two measurements and inverse Fourier transform the result, and crop out the twin image). If the pinhole does not generate a homogenous plane wave (because of the finite size of the pinhole), the optional third image can be used to correct this, by Fourier transforming the reconstructed image (to go from the pupil plane to image plane), and divide the result by the square root of the third measurement.

In an embodiment, the pinhole may be apodized to create a smoother reference beam.

Using the same lens for illumination and detection means that a more intense illuminating beam has to pass through the optical system on its way to the substrate. Any internal reflection or scattering from the surfaces leads to stray light which can cause imaging errors, particularly when the diffraction from the targets is weak.

FIGS. 14(b) and (c) illustrate a simplified arrangement of the objective lens arrangement which mitigates double reflections and scattering by using a divided first lens L1' in place of first lens (objective lens) L1 in FIG. 14(a). Divided first lens L1' comprises gaps LG which divides the first lens L1 into three lens portions LP1, LP2, LP3. The gaps LG should be sufficiently large to prevent light coupling between the lens portions LP1, LP2, LP3. Sufficiently large in this context may be significantly larger than the wavelength of the light (e.g., 100λ). The gaps LG may optionally be filled with absorbing material. The use of a single lens for illumination and detection ensures that the imaging condition is satisfied and the zeroth and first order are path length matched.

The first lens portion LP1 is used to focus the illumination beam IB onto the sample T, the second lens portion LP2 is used for capturing the higher diffracted order(s) 1st, and the third lens portion LP3 is used for capturing the specularly reflected zeroth order 0th. A filtering pinhole FPH may be provided to spatially filter the zeroth order 0th reference beam. The zeroth order and first order beams will then be focused at the intermediary image plane IIP by second lens L2 (not shown in FIG. 14(c). Note that the concept of a divided lens can be used in other embodiments described above, although such a lens may comprise only a first lens portion (for the illumination beam) and second portion (for the diffracted order) as the zeroth order is then typically not captured.

In this arrangement (optionally), the use of a beam splitter BS is also avoided by the direct use of a fiber tip of an illumination fiber IF as the point source placed at a pupil plane of the divided first lens L1'. This makes the system compact and light efficient when compared to using a beam splitter. This is, however, at the cost of overlay now being measurable only in wafer rotation mode.

The advantage of such zeroth order self-referencing holography methods is that the mask no longer has to be shifted. By placing the pinhole to coincide with the zeroth order while reconstructing a higher order (e.g., the +1st or −1st order), a strong reference wave is guaranteed, and the position of the pinhole can be the same for different samples (as the position of the zeroth order is fixed). Also, only one reconstruction needs to be performed because the reconstruction is for only one side of the pinhole: in contrast the arrangement of FIG. 6 requires the stitching together of different reconstruction regions, each reconstructed separately. However, the system will now have a reduced NA because part of the NA is used for illumination and part is used for capturing the zeroth order. Additionally, there remains a higher risk of stray light: the fact that the illuminating beam and the zeroth order (which both have high intensity) have to pass through the objective lens increases the risk of stray light interfering with the imaging process (although this can be mitigated by using a divided lens as described).

Another self-referencing holography method may use binary holograms or Lee holograms to perform single-shot phase retrieval by phase-shifting holography without fast Fourier transform calculations.

Figure 15:
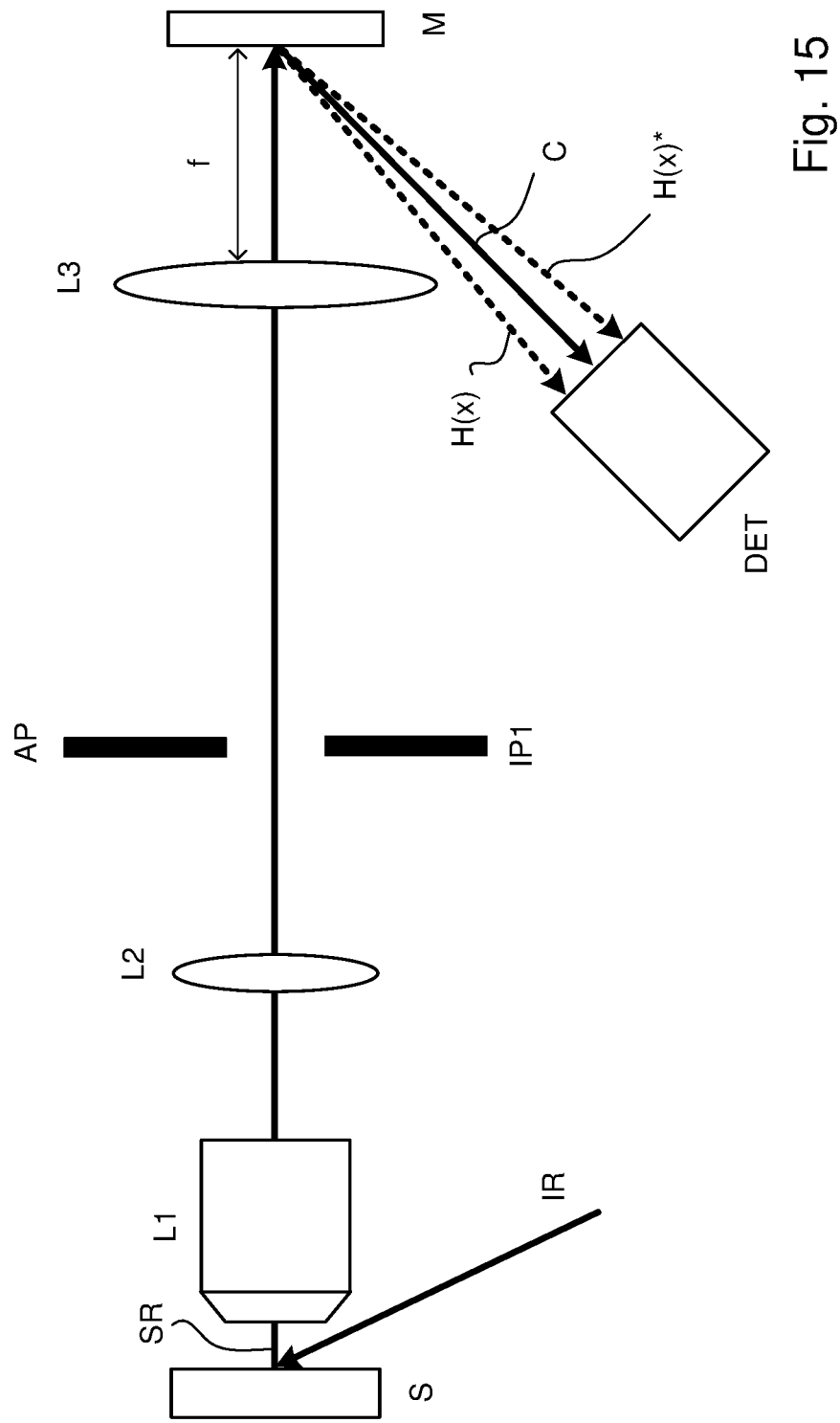
FIG. 15 is a schematic illustration of a metrology apparatus according to an embodiment suitable for a Lee hologram based method.

FIG. 15 is a schematic representation of a simplified arrangement of such an embodiment. A sample S is illuminated by illumination radiation IR incident at a certain angle with respect to the sample surface. The scattered radiation SR from the sample surface is collected by a first lens L1 (e.g., an objective lens of a metrology device) and subsequently imaged by a second lens L2 (e.g., a tube lens) onto a first image plane IP1. An aperture AP is used to truncate the image of the sample at a first image plane IP1, thereby preventing overlap of the three captured images. It should be noted that the aperture may be dispensed with if the arrangement and sample/illumination parameters are such that the images will be separate in any case, without its inclusion. The (truncated) first image is then re-imaged by a third lens L3 onto a detection plane where a detector DET (e.g., a CCD camera) is located. A modulator M, which may comprise a spatial light modulator (SLM) and more specifically may comprise a digital micromirror device (DMD), is placed at a Fourier plane of the third lens L3. A DMD is a microelectromechanical system device which comprises a plurality (e.g., millions) of tiny switchable mirrors. Such tiny mirrors may have micrometre-scale dimensions and each mirror (or pixel) can be individually controlled/switched. DMDs have been successfully applied to shape laser beams and generate various different transverse laser modes, such as Laguerre-Gaussian beam, Ince-Gaussian modes as well as cylindrically symmetric vector-vortex beams. The modulator M imposes a binary modulation to the scattered radiation at this Fourier plane.

According to an embodiment, the pattern imparted by the modulator M may be a binary hologram representation of a complex field modulation of the light phase and the amplitude, e.g., a Lee hologram. Where the modulator comprises a DMD, since a DMD can only apply binary amplitude modulation, two conversion steps may be employed. A first step may comprise converting an intended complex-valued modulation to an expression in terms of a positive real-valued Lee hologram, F(x), i.e.:

$$F(x)=C+H(x)e^{ivx}H(x)^*e^{-ivx}$$

where H(x) is the intended complex-valued modulation of a complex-valued Lee hologram and $e^{ivx}$ defines a carrier wave. The positive real-valued Lee hologram, i.e. F(x) of Equation (1), may then be converted to a binary hologram, e.g., by dithering the positive real-valued Lee hologram F(x).

The result of the positive real-valued modulation F(x) in a Fourier plane of the illumination radiation, is the generation three orders C, H(x), H(x)* which are spatially separated at the detection plane; each of which corresponding to a respective coefficient of the three terms of the above equation for F(x). For example, the three spatially separated radiation beams comprise: 1) an unmodulated beam corresponding to the constant coefficient C; 2) a first modulated beam corresponding to the modulation coefficient H(x); and 3) a second modulated beam corresponding to the modulation coefficient H(x)*.

By choosing an appropriate value for H(x); e.g., to comprise a phase shift of $\frac{2}{3}\pi c$ with respect to a reference point $x_0$, the three orders which are measured at the detector plane will correspond to the images required for phase-shifting interferometry: namely a field which interferes with a plane wave that is phase-shifted by $-\frac{2}{3}\pi$, 0, and $\frac{2}{3}\pi$ radians for each beam respectively. The complex-valued field can be recovered simply by taking a linear combination of these three images.

It should be noted that other choices of H(x) can be applied to obtain a different kind of diversity for phase retrieval. For example, if H(x) is chosen to be a quadratic phase profile, it becomes possible to measure three through-focus images in a single shot which can be used for iterative phase retrieval.

An advantage of this method is that DMDs are fast, can work over a broad wavelength range, and require no mechanical movement. Also, the phase retrieval only requires a single shot and no FFTs. Another advantage is that the one modulation device (e.g., DMD) can simultaneously perform both phase retrieval and aberration correction. By controlling the DMD to impose an aberration correction function (e.g., based on a pre-characterization of the optical aberration of the metrology system or an optimization method based on monitoring image quality while changing the imposed correction till optimized), the first modulated radiation beam H(x) will comprise an aberration corrected image.

Figure 16:
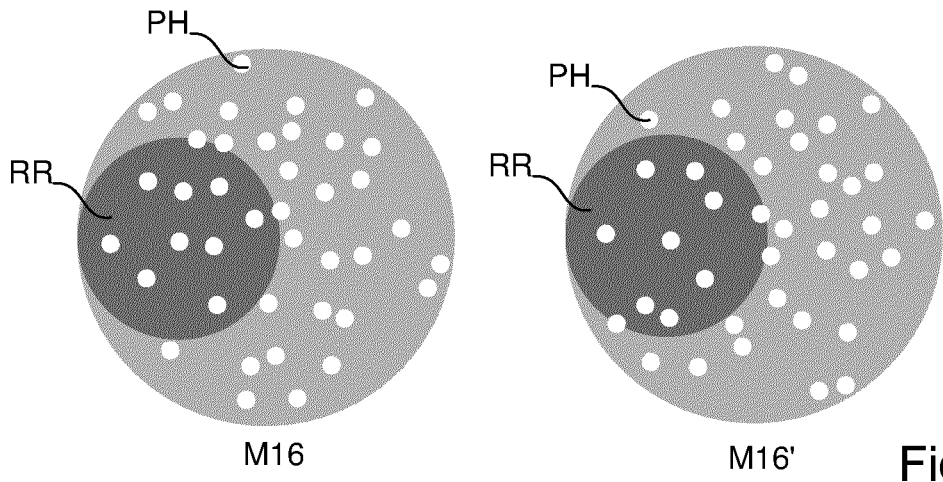
FIG. 16 is a schematic illustration of an iterative method of determining a complex-valued field, according to an embodiment of the invention.

FIG. 16 illustrates a Fourier ptychographic phase retrieval embodiment using a rotating pinhole mask M15 comprising a plurality of pinholes PH. The pinhole mask M16, with its axis of rotation outside of the beam path, is rotated in the Fourier plane. This introduces a series of known amplitude modulations, which will be used in a Fourier ptychographic phase retrieval for a reconstruction region RR (shaded darker). Fourier ptychography is a known method (though typically implemented differently), see, for example, G. Zheng et al., "Wide-field, high-resolution Fourier ptychographic microscopy." Nature photonics 7.9 (2013): 739 (incorporated herein by reference).

Such a mask can ensure a robust reconstruction, because each pinhole imposes a strong localization constraint. If a high intensity is detected in the image plane, it can be assumed that it must come from a restricted area defined by the pinholes. By moving the pinholes around to obtain a sequence of images for different pinhole positions (mask M16' is the same mask having been rotated), reconstruction almost becomes a matter of combinatorics: in each image, it can be assumed that detections of high intensity each come from an area corresponding with a pinhole (the pinhole locations being known). Therefore, if a set of measurements all comprise high intensity, the area covered by a pinhole which is common for all of these images can be determined, which then must be the source of the detected energy. By contrast, applying focus variation results in applied phase modulations in the Fourier plane, which gives no such localization constraint.

As such, a reconstruction method may comprise iteratively minimizing the difference between an estimated image amplitude (computed from an estimated field in the Fourier plane that is constrained by the known modulations, i.e. pinhole positions) and the measured image amplitude.

The phase is determined iteratively in this embodiment (unlike the other embodiments), but it can be expected that the number required iterations of the phase retrieval algorithm would be considerably fewer (e.g., in the region of a factor of 10), compared to methods based on focus diversity.

Figure 17:
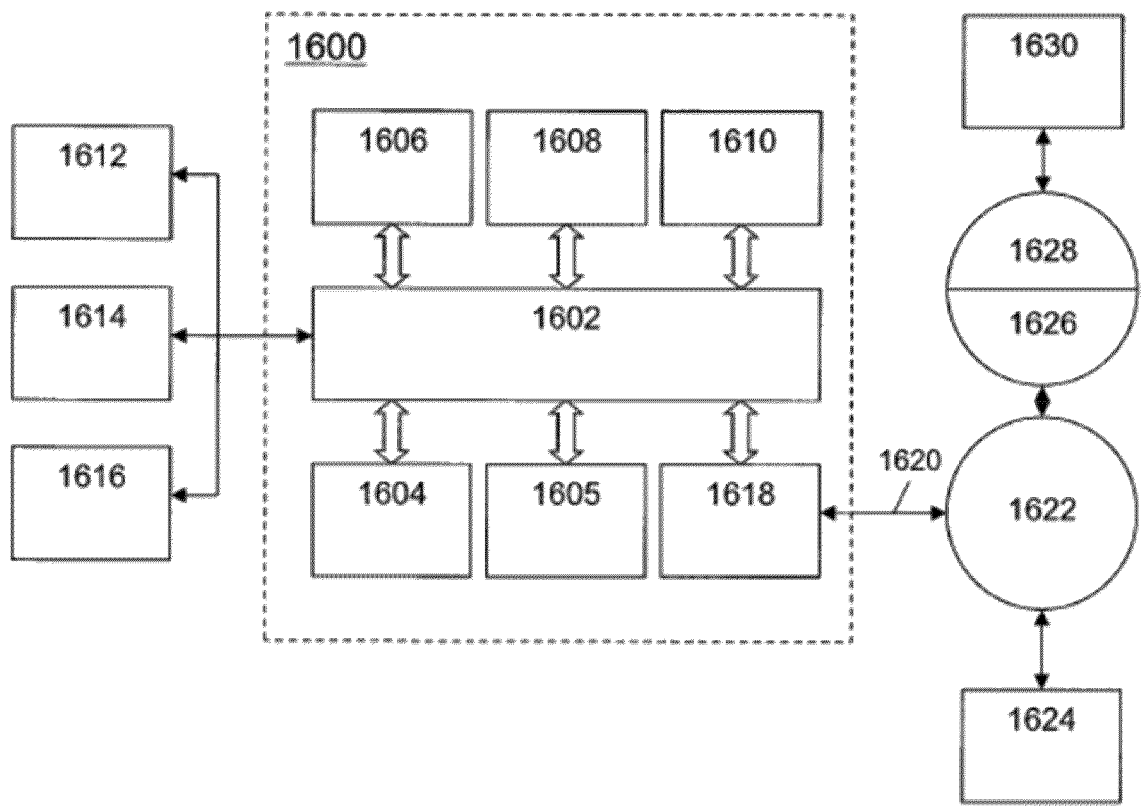
FIG. 17 is a block diagram illustrating a computer system which may assist in implementing methods according to embodiments of the invention.

FIG. 17 is a block diagram that illustrates a computer system 1600 that may assist in implementing the methods and flows disclosed herein. Computer system 1600 includes a bus 1602 or other communication mechanism for communicating information, and a processor 1604 (or multiple processors 1604 and 1605) coupled with bus 1602 for processing information. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multiprocessing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also preferably includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 may send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

Further embodiments are disclosed in the subsequent numbered clauses:

1. A method of determining a complex-valued field relating to a sample measured using an imaging system, comprising: obtaining image data relating to a series of images of the sample, imaged at an image plane of the imaging system, and for which at least two different modulation functions are imposed in a Fourier plane of the imaging system; and determining the complex-valued field from the imaging data based on the imposed modulation functions.

2. A method as defined in clause 1, wherein said at least two different modulation functions comprise a plurality of pairs of modulation functions, each of pair of modulation functions comprising modulation functions which differ only in a perturbation region.

3. A method as defined in clause 2, wherein each modulation function comprises a corresponding reconstruction region and a blocked region, the reconstruction region covering a different portion of the Fourier plane for each different pair of modulation functions.

4. A method as defined in clause 2 or 3, wherein the pairs of modulation functions are realized by a binary amplitude modulator.

5. A method as defined in clause 2 or 3, wherein the pairs of modulation functions are realized by a moving mask having a selectively closing aperture for providing the difference in the modulation functions at said perturbation region.

6. A method as defined in clause 5, wherein the moving mask is a rotating mask and the selectively closing aperture is located at the axis of rotation.

7. A method as defined in clause 2, wherein the pairs of modulation functions are realized by a phase modulator.

8. A method as defined in clause 7, wherein the perturbation region is located inside the reconstruction region.

9. A method as defined in any of clauses 2 to 8, wherein the perturbation region is located at a region of high intensity in the Fourier plane.

10. A method as defined in any of clauses 2 to 9, comprising the steps of:

determining a plurality of partial reconstructed Fourier transforms by inverse Fourier transforming the series of images and determining the difference between the results for pairs of images corresponding to each of said plurality of pairs of modulation functions;

combining the partial reconstructed Fourier transforms to obtain a reconstructed Fourier transform; and determining said complex-valued field from the reconstructed Fourier transform.

11. A method as defined in any of clauses 2 to 10, comprising a step of reconstructing the field at the perturbation region by performing one or more of:
inferring the amplitude at the perturbation region from a corresponding image of the Fourier plane; performing said method to reconstruct for two or more perturbation regions and using one of the reconstructions to reconstruct the perturbation region of the other;
iteratively reconstructing the field at the perturbation region using Fourier ptychography.

12. A method as defined in clause 1, wherein the modulation function comprises an amplitude grating and reference pinhole; and said method comprises:
capturing multiple diffraction orders diffracted by said grating in a single image; and determining the complex-valued field from the imaged multiple diffraction orders.

13. A method as defined in clause 12, wherein the complex-valued field is determined from the imaging data using one of Fourier transform holography or parallel phase shifting holography.

14. A method as defined in clause 12 or 13, wherein the reference pinhole is located at a region of high intensity in the Fourier plane.

15. A method as defined in clause 1, comprising defining at least three regions in the Fourier plane: a first reconstruction region, a second region and a third region;
reconstructing the field for the first reconstruction region from said image data obtained from at least a first modulation function which transmits or reflects only in the first reconstruction region and at a plurality of reference points;
reconstructing the field for the second region and third region by:
  determining a first convolution of the field for the first reconstruction region and for the second region from image data obtained from a second modulation function which transmits or reflects only in the first reconstruction region and second region and a third modulation function which transmits or reflects only in the second region;
  determining a second convolution of the field for the first reconstruction region and for the third region from image data obtained from a fourth modulation function which transmits or reflects only in the first reconstruction region and third region and a fifth modulation function which transmits or reflects only in the third region;
  deconvolving the first convolution to reconstruct the field for the first region and the second convolution to reconstruct the field for the second region using the reconstructed field for the first reconstruction region;
  combining the reconstruction fields for the first reconstruction region, second region and third region to determine said complex-valued field.

16. A method as defined in clause 1, comprising:
constructing a plurality of systems of linear equations from said image data comprising at least a first image obtained from at least a first modulation function corresponding to the full field to be reconstructed, a second image obtained from a second modulation function corresponding to a first half of said full field and a third image obtained from a third modulation function corresponding to a second half of said full field; and
solving said plurality of systems of linear equations non-iteratively using double-blind Fourier holography.

17. A method as defined in clause 1, wherein the at least two different modulation functions comprise a first modulation function used to obtain a first image of an image pair and a second modulation function used to obtain the second image of the image pair, and wherein the only substantial difference between the modulation functions is that the second modulation function blocks a selected higher diffraction order and the first modulation function does not block the selected higher order.

18. A method as defined in clause 17, wherein the first modulation function and second modulation function each block less than 10%, or 5% of the area defined by Fourier plane.

19. A method as defined in clause 17 or 18, wherein the first modulation function and second modulation function are configured to block a minimal amount of diffracted radiation, other than the blocking of the selected higher order by the second modulation function.

20. A method as defined in clause 17, 18 or 19, further comprising:
determining a difference image of the first image and second image for each of said image pairs, each of said difference images describing the image in terms of only linear imaging terms.

21. A method as defined in clause 20, comprising capturing a plurality of said image pairs, each relating to one of a plurality of focus levels; and determining a difference image for each image pair to obtain a thru-focus series of difference images; and
separating a twin image from a regular image in each of said determined difference images by a linear fitting of two unknowns over the thru-focus series of said difference images.

22. A method as defined in clause 1, wherein:
The two different modulation functions differ only by the selective opening and closing of a reference pinhole defining a perturbation region, said perturbation region being aligned in the Fourier plane with a zeroth order of reflected radiation from the sample, and
said determining the complex-valued field is performed by a self-referenced holography method, referenced using said zeroth order.

23. A method as defined in clause 22, wherein each of the two different modulation functions substantially pass the full field of the Fourier plane, other than the perturbation region being blocked in only one of said two different modulation functions.

24. A method as defined in clause 22 or 23, wherein the determining step comprises:
determining the difference of a first measurement corresponding to a first modulation function of the two different modulation functions and a second image corresponding to a second modulation function of the two different modulation functions; and
inverse Fourier transform the result to obtain a reconstructed complex field.

25. A method as defined in clause 24, wherein the determining step comprises further comprises cropping out a twin field from the reconstructed complex field.

26. A method as defined in clause 24 or 25, further comprising obtaining a third measurement corresponding to a third modulation function which blocks the full field other than the perturbation region and using the third measurement to correct the reconstructed complex field for the effects of the finite size of the perturbation region.

27. A method as defined in any of clauses 22 to 26, further comprising:
focusing a point source onto the sample,
focusing the zeroth order and at least one higher diffracted order at an intermediate image plane; and imposing the modulation functions at a Fourier plane of a lens which reimagines the intermediate image plane.

28. A method as defined in any of clauses 22 to 27, comprising using a divided objective lens to illuminate the sample and capture the zeroth radiation and at least one higher diffracted order; wherein the divided objective lens comprises a plurality of portions separated by gaps, said plurality of portions comprising a first portion for focusing illumination radiation onto the sample, a second portion for capturing the at least one higher diffracted order and a third portion for capturing the zeroth order.

29. A method as defined in any of clauses 22 to 28, wherein the reference pinhole is apodized.

30. A method as defined in any preceding clause, wherein the step of determining the complex-valued field is performed non-iteratively for at least the majority of the complex-valued field.

31. A method as defined in clause 1, wherein the modulation function comprises a mask with a plurality of pinhole apertures which is at a different orientation for different images of the sequence of images; and the step of determining said complex-valued field comprises using an iterative Fourier ptychography reconstruction to reconstruct said complex-valued field.

32. A method as defined in clause 1, wherein the modulation function comprises a binary representation of an intended complex-valued modulation.

33. A method as defined in clause 32, wherein the binary representation of an intended complex-valued modulation comprises a Lee hologram representation of the intended complex-valued modulation.

34. A method as defined in clause 33, comprising detecting three spatially separated orders, an unmodulated order and two modulated by the intended complex-valued modulation and mutually opposite-signed carrier wave.

35. A method as defined in clause 33 or 34 wherein said intended complex-valued modulation comprises a phase shift of $\frac{2}{3}\pi$ with respect to a reference point.

36. A method as defined in clause 35 wherein said intended complex-valued modulation further comprises an aberration correction component to correct for aberration in the imaging system.

37. A metrology device for performing the method of any preceding clause, comprising:
an imaging system for imaging a field reflected from a sample;
at least one modulator at a Fourier plane of the imaging system for defining each modulation function; and
a detector at an image plane of the imaging system for capturing each of said images.

38. A metrology device as defined in clause 37, further comprising a second detector for imaging the Fourier plane prior to said modulation.

39. A computer program comprising program instructions operable to perform the method of any of clauses 1 to 36, when run on a suitable apparatus.

40. A non-transient computer program carrier comprising the computer program of clause 39.

41. A processing device operable to run the computer program of clause 39.

42. A metrology device for performing the method of any of clauses 22 to 29, comprising:
an imaging system for imaging a field reflected from a sample;
at least one modulator at a Fourier plane of the imaging system for defining each modulation function; and
a detector at an image plane of the imaging system for capturing each of said images;
wherein the imaging system comprises:
a first lens for focusing a point source onto the sample and capturing the zeroth order and at least one higher diffracted order,
a second lens for focusing the captured zeroth order and at least one higher diffracted order at an intermediate image plane; and
a third lens which re-images the intermediate image plane; and
wherein said modulator is located at the Fourier plane of the third lens.

43. A metrology device as defined in clause 42, wherein the first lens comprises a divided lens having a plurality of portions separated by gaps, said plurality of portions comprising a first portion for focusing the point source onto the sample, a second portion for capturing the at least one higher diffracted order and a third portion for capturing the zeroth order.

44. A metrology device as defined in clause 42 or 43 further comprising an illumination fiber or pinhole focused on the first lens as the point source.

45. A metrology device as defined in clause 42, 43 or 44 wherein said modulator comprises a pinhole aperture which can be selectively opened and closed to define respectively a first modulation function and a second modulation function, said pinhole aperture being at a location coinciding with the zeroth order at the Fourier plane, each of the first modulation function and a second modulation function otherwise passing the full field at the Fourier plane.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). The term "metrology apparatus" may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets may be close to the resolution limit of the optical system of the scatterometer or may be smaller, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method, comprising:
    imaging, by an imaging system, a field reflected from a sample;
    imposing, at a Fourier plane of the imaging system, at least two different modulation functions in the reflected field;
    detecting, at an image plane of the imaging system, a series of images of the sample;
    obtaining image data relating to the series of images of the sample; and
    determining a complex-valued field from the image data based on the imposed modulation functions,
    wherein the at least two different modulation functions comprise a plurality of pairs of modulation functions, each of the pairs of modulation functions comprising modulation functions that differ only in a perturbation region.

2. The method of claim 1, wherein each modulation function comprises a corresponding reconstruction region and a blocked region, the reconstruction region covering a different portion of the Fourier plane for each different pair of modulation functions.

3. The method of claim 1, wherein at least one of:
    the pairs of modulation functions are realized by a binary amplitude modulator; and
    the pairs of modulation functions are realized by a moving mask having a selectively closing aperture configured to provide a difference in the modulation functions at the perturbation region, wherein the moving mask is a rotating mask, and the selectively closing aperture is located at the axis of rotation.

4. The method of claim 1, wherein the pairs of modulation functions are realized by a phase modulator, and wherein the perturbation region is located inside a reconstruction region.

5. The method of claim 1, wherein the perturbation region is located at a region of high intensity in the Fourier plane.

6. The method of claim 1, comprising the steps of:
    determining a plurality of partial reconstructed Fourier transforms by inverse Fourier transforming the series of images and determining a difference between the results for pairs of images corresponding to each of the plurality of pairs of modulation functions;
    combining the partial reconstructed Fourier transforms to obtain a reconstructed Fourier transform; and
    determining the complex-valued field from the reconstructed Fourier transform.

7. The method of claim 1, comprising a step of reconstructing the field at the perturbation region by performing one or more of:
    inferring an amplitude at the perturbation region from a corresponding image of the Fourier plane;
    reconstructing two or more perturbation regions and using one of the reconstructions to reconstruct the perturbation region of the other; and
    iteratively reconstructing the field at the perturbation region using Fourier ptychography.

8. The method of claim 1, wherein the at least two different modulation functions comprise an amplitude grating and reference pinhole, and the method comprises:
    capturing multiple diffraction orders diffracted by the amplitude grating in a single image; and
    determining a complex-valued field from the imaged multiple diffraction orders,
    wherein the complex-valued field is determined from the image data using one of Fourier transform holography or parallel phase shifting holography, and
    wherein the reference pinhole is located at a region of high intensity in the Fourier plane.

9. The method of claim 1, comprising defining at least three regions in the Fourier plane including a first reconstruction region, a second region, and a third region;
    reconstructing a field for the first reconstruction region from the image data obtained from at least a first modulation function that transmits or reflects only in the first reconstruction region and at a plurality of reference points;
    reconstructing a field for the second region and third region by:
    determining a first convolution of the field for the first reconstruction region and for a second region from image data obtained from a second modulation function that transmits or reflects only in the first reconstruction region and the second region and a third modulation function that transmits or reflects only in the second region;
    determining a second convolution of the field for the first reconstruction region and for the third region from image data obtained from a fourth modulation function that transmits or reflects only in the first reconstruction region and third region and a fifth modulation function that transmits or reflects only in the third region;
    deconvolving the first convolution to reconstruct the field for the first region and the second convolution to reconstruct the field for the second region using the reconstructed field for the first reconstruction region; and combining the reconstruction fields for the first reconstruction region, the second region, and the third region to determine the complex-valued field.

10. The method of claim 1, comprising:

constructing a plurality of systems of linear equations from the image data comprising at least a first image obtained from at least a first modulation function corresponding to a full field to be reconstructed, a second image obtained from a second modulation function corresponding to a first half of the full field and a third image obtained from a third modulation function corresponding to a second half of the full field; and solving the plurality of systems of linear equations non-iteratively using double-blind Fourier holography.

11. The method of claim 1, wherein the step of determining the complex-valued field is performed non-iteratively for at least a majority of the complex-valued field.

12. The method of claim 1, wherein the at least two different modulation functions are generated using a mask with a plurality of pinhole apertures at a different orientation for different images of the series of images; and the step of determining the complex-valued field comprises using an iterative Fourier ptychography reconstruction to reconstruct the complex-valued field.

13. A metrology device for performing the method of claim 1, comprising:

an imaging system for imaging a field reflected from a sample;

at least one modulator at a Fourier plane of the imaging system for defining each modulation function; and a detector at an image plane of the imaging system for capturing each of the images.

14. A non-transitory computer readable medium comprising processor readable instructions which, when run on a processor controlled apparatus, cause the processor controlled apparatus to perform a method comprising:

imaging a field reflected from a sample;

imposing, at a Fourier plane of an imaging system, at least two different modulation functions in the reflected field;

detecting, at an image plane of the imaging system, a series of images of the sample;

obtaining image data relating to the series of images of the sample, imaged at an image plane of the imaging system, and for which at least two different modulation functions are imposed in a Fourier plane of the imaging system; and determining a complex-valued field from the image data based on the imposed modulation functions when run on a suitable apparatus, wherein the at least two different modulation functions comprise a plurality of pairs of modulation functions, each of the pairs of modulation functions comprising modulation functions that differ only in a perturbation region.

\* \* \* \* \*